United States Patent
Kodama et al.

(10) Patent No.: US 7,676,123 B2
(45) Date of Patent: Mar. 9, 2010

(54) OPTICAL AND ELECTRICAL CIRCUIT BOARD AND METHOD OF MANUFACTURING THE SAME

(75) Inventors: Hiroaki Kodama, Ibi-gun (JP); Liyi Chen, Ibi-gun (JP); Kensaku Nakashima, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/207,363

(22) Filed: Sep. 9, 2008

(65) Prior Publication Data

US 2009/0010594 A1    Jan. 8, 2009

Related U.S. Application Data

(63) Continuation of application No. PCT/JP2007/052990, filed on Feb. 19, 2007.

(30) Foreign Application Priority Data

Mar. 10, 2006    (JP) ............... 2006-066706

(51) Int. Cl.
- G02B 6/12    (2006.01)
- G02B 6/32    (2006.01)
- G02B 6/26    (2006.01)
- G02B 6/42    (2006.01)

(52) U.S. Cl. ............... 385/14; 385/33; 385/47
(58) Field of Classification Search ............ 385/14, 385/33–35, 47–49
See application file for complete search history.

(56) References Cited

U.S. PATENT DOCUMENTS

| 2004/0212030 A1* | 10/2004 | Asai ..................... 257/432 |
| 2004/0264838 A1* | 12/2004 | Uchida et al. ............ 385/14 |
| 2006/0050414 A1* | 3/2006 | Harchanko ............... 359/811 |
| 2007/0085215 A1* | 4/2007 | Budd et al. ............. 257/778 |

FOREIGN PATENT DOCUMENTS

| JP | 8-286002 | * | 11/1996 |
| JP | 2002-189137 | * | 7/2002 |
| JP | 2003-248129 | * | 9/2003 |
| JP | 2005-266119 | * | 9/2005 |
| JP | 2006-38958 | * | 2/2006 |
| JP | 2006-047764 | * | 2/2006 |

OTHER PUBLICATIONS

English translation of International Preliminary Report on Patentability issued on Sep. 16, 2008, w/ Written Opinion of the International Searching Authority.

* cited by examiner

Primary Examiner—Uyen-Chau N Le
Assistant Examiner—Rhonda S Peace
(74) Attorney, Agent, or Firm—Ditthavong Mori & Steiner, P.C.

(57) ABSTRACT

An optical and electrical circuit board includes a patterned electrical wiring and a micro convex lens. The micro convex lens is provided in at least one hole formed in the optical and electrical circuit board.

9 Claims, 13 Drawing Sheets

OPTICAL AND ELECTRICAL CIRCUIT BOARD AND METHOD OF MANUFACTURING THE SAME

CROSS-REFERENCE TO RELATED APPLICATIONS

The present application is a continuation application claiming priority under 35 U.S.C. §120 to International Application No. PCT/JP2007/052990 filed Feb. 19, 2007, which claims priority to Japanese Patent Application No. 2006-066706, filed on Mar. 10, 2006. The contents of these applications are incorporated herein by reference in their entirety.

BACKGROUND OF THE INVENTION

1. Field of the Invention

The present invention relates to an optical and electrical circuit board, and a method of manufacturing the optical and electrical circuit board.

2. Discussion of the Background

In recent years, the amount of communication data of the Internet or the like is increasing dramatically, and a technology for realizing high-speed and large capacity communication using an optical signal by converting an electrical signal in a signal processor and an optical signal transmitted through an optical fiber to each other become increasingly important.

An optical and electrical circuit board having a structure that a microlens condensing an optical signal is disposed between an optical signal receiving/transmitting element and an optical waveguide in order to convert an electrical signal and an optical signal to each other, has been proposed.

Methods of forming such a microlens include a method using a mold, a forming method by dropping lens material, a method of forming a lens by heating and softening lens material cylindrical shaped, a method of exposing lens material to exposure light which has passed through a mask. In each of the conventional manufacturing methods, a microlens is formed separately from an optical and electrical circuit board and is mounted on the optical and electrical circuit board, so that the cost of mounting the microlens is high and alignment of the microlens to the substrate is difficult.

A method of forming a microlens using a mask is described in, for example, Japanese Patent Application Laid-open No. 8-286002. The contents of Japanese Patent Application Laid-open No. 8-286002 are incorporated herein by reference in their entirety.

SUMMARY OF THE INVENTION

According to one aspect of the present invention, an optical and electrical circuit board includes a patterned electrical wiring and a micro convex lens. The micro convex lens is provided in at least one hole formed in the optical and electrical circuit board.

According to another aspect of the present invention, a method of manufacturing an optical and electrical circuit board includes filling first photoreactive material into at least one hole which is formed in a substrate having a patterned electrical wiring and which passes through the substrate in a thickness direction thereof. The first photoreactive material is partially exposed from one opening of the hole to form a cured portion and a soluble portion. Then, the soluble portion of the first photoreactive material is dissolved and removed to form a micro convex lens in the hole.

According to further aspect of the present invention, a method of manufacturing an optical and electrical circuit board includes filling second photoreactive material into at least one hole which is formed in a substrate having a patterned electrical wiring and which passes through the substrate in a thickness direction thereof. The second photoreactive material is partially exposed from one opening of the hole to form a cured portion and a soluble portion. Then, the soluble portion of the second photoreactive material is dissolved and removed to form a filling portion having a concave part in the hole. Second filling material having optical transparency and a refractive index higher than a refractive index of the filling portion is filled in the concave part. Then, the second filling material is cured to form a micro convex lens.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A shows a step of forming metal layers, FIG. 1B shows a step of forming a hole, and FIG. 1C shows a step of adhering a supporting film;

FIG. 2A shows a step of filling first photoreactive material, FIG. 2B shows a step of forming micro convex lenses supported by a supporting portion, and FIG. 2C shows a step of removing uncured first photoreactive material;

FIG. 3A shows a step of filling first filling material, FIG. 3B shows a step of curing, and FIG. 3C shows a step of grinding;

FIG. 4A shows a step of patterning metal layers, FIG. 4B shows a step of forming a protection layer, and FIG. 4C shows a step of forming optical waveguides;

FIG. 5A shows a step of forming notches, and FIG. 5B shows a step of forming reflectors;

FIG. 6A shows a step of forming isolated micro convex lenses, FIG. 6B shows a step of removing remained first photoreactive material.

FIG. 7A shows a step of removing a supporting film, FIG. 7B shows a step of patterning metal layers, and FIG. 7C shows a step of forming optical waveguides and reflectors;

FIG. 8A shows a step of adhering a supporting film to a side opposite to a side in the case of the first embodiment, FIG. 8B shows a step of filling second photoreactive material, and FIG. 8C shows a step of forming a filling portion having a depression;

FIG. 9A shows a step of removing uncured second photoreactive material, FIG. 9B shows a step of injecting and curing second filling material, and FIG. 9C shows a step of grinding;

DETAILED DESCRIPTION OF THE EMBODIMENTS

Figure 1A:
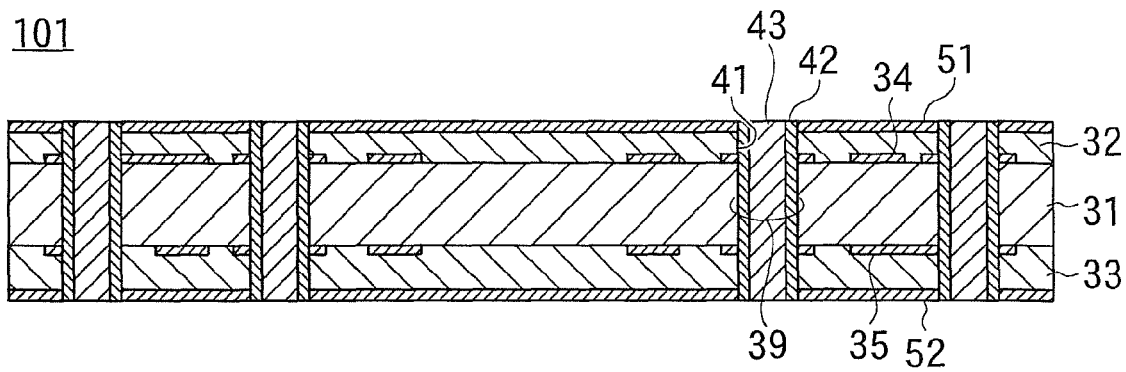
FIGS. 1A to 1C illustrate a process of manufacturing the optical and electrical circuit board of a first embodiment of the present invention.

The embodiments will now be described with reference to the accompanying drawings, wherein like reference numerals designate corresponding or identical elements throughout the various drawings.

Figure 5A:
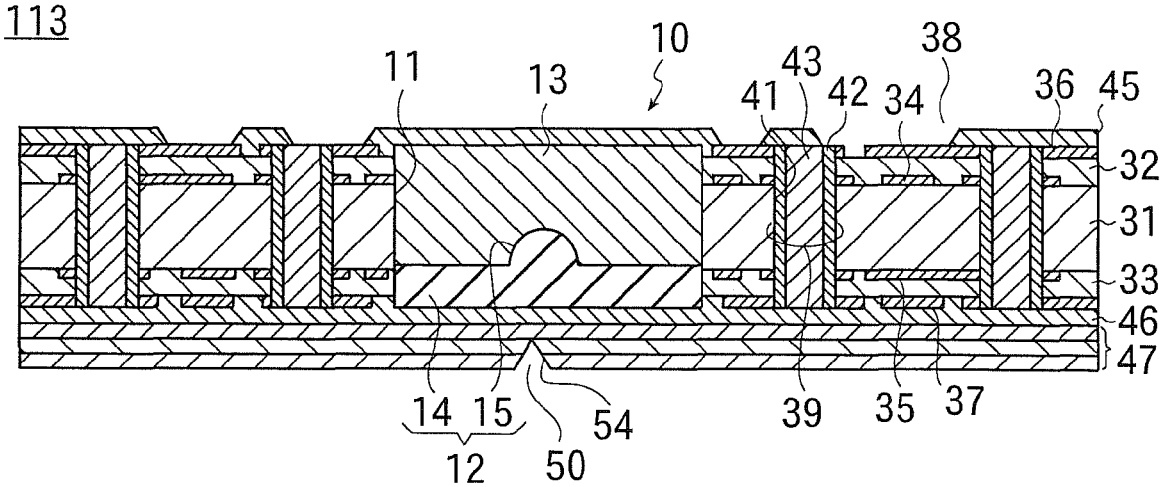
FIGS. 5A and 5B illustrate the process of manufacturing the optical and electrical circuit board of the first embodiment of the present invention.
Figure 5B:
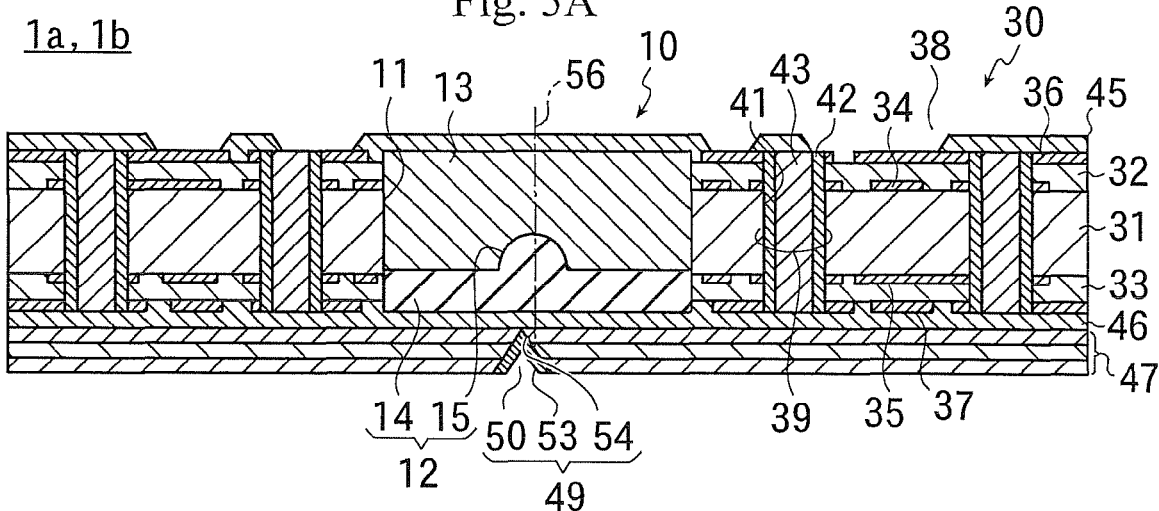

The reference numeral 1a in FIG. 5B denotes a first embodiment of an optical and electrical circuit board of the present invention.

An optical and electrical circuit board 1a has a multi-layer substrate section 30 and a lens section 10. The multi-layer substrate section 30 is structured in such a manner that one or more layers of substrate, insulating layers, and wiring layers which are electrical wirings are laminated. The multi-layer substrate section 30 has a base layer 31, patterned wiring layers 34 and 35 are disposed on the top surface and back surface of the base layer 31, insulating layers 32 and 33 are disposed so as to cover the wiring layers 34 and 35, respectively, on the top surface and back surface of the base layer 31, and patterned wiring layers 36 and 37 are disposed on the surfaces of the insulating layers 32 and 33, respectively. The wiring layers 34 to 37 of different layers are separated from each other by the base layer 31 and the insulating layers 32 and 33.

In this embodiment, only one of the insulating layers 32 and 33 and only one of the wiring layers 34 and 35 are formed on each side of the base layer 31, and only two of the wiring layers 34 to 37 including wiring layers 36 and 37 on the insulating layers 32 and 33 are formed on each side of the base layer 31. However, a multi-layer substrate having three or more layers on one side including insulating layers and wiring layer further laminated is also included in the multi-layer substrate section 30 of the present invention.

In addition, on the surfaces of the outermost wiring layers 36 and 37, protection layers 45, 46 (also known as solder resist layers) are disposed so as to cover the wiring layers 36 and 37, respectively, in order that the optical and electrical circuit board 1a is not shorted to external electric components.

For the base layer 31 and the insulating layers 32 and 33, ceramic may be used in addition to resin such as epoxy. For the wiring layers 34 to 37, patterned metal films such as copper films can be used.

In the multi-layer substrate section 30, through-holes 41 penetrating it in the thickness direction thereof are formed, and conductive interlayer connecting layer 42 composed of electroless plating layer is formed on the inner peripheral surface of the through-hole 41. The inside of the through-hole 41, that is, space surrounded by the interlayer connecting layer 42, is filled with resin filler 43.

The interlayer connecting layer 42 is in contact with part of wiring layers 34 to 37 and mutually connect the wiring layers 34 to 37 located in different layers so that electrical signal is transmitted between the wiring layers 34 and 37 in different layers through the interfacial connecting layers 42.

Next, a hole 11 having a diameter larger than that of the through-hole 41 is formed in the multi-layer substrate section 30, and the lens section 10 is disposed in the hole 11.

The lens section 10 has an optical condensing portion 12 for condensing light and a filling portion 13 which fills a portion other than the optical condensing portion 12 inside the hole 11.

The optical condensing portion 12 is disposed at an end of the hole 11, and the filling portion 13 is located on the opposite side of the optical condensing portion 12 in the hole 11.

The optical condensing portion 12 has one or more micro convex lenses 15 and a supporting portion 14 located on side faces of the micro convex lenses 15.

The micro convex lenses 15 are located apart from the inner peripheral side surface of the hole 11, and the supporting portion 14 is in contact with the inner peripheral side surface of the hole 11 and is fixed to the contact portion, so that each of the micro convex lenses 15 is fixed to the inner peripheral side surface of the hole 11 through the supporting portion 14.

Furthermore, the optical condensing portion 12 and the filling portion 13 are in close contact with each other, and the filling portion is in contact with the inner peripheral side surface of the hole 11 and is fixed to the contact portion. The micro convex lenses 15 are in close contact with the filling portion 13 and are fixed to the close contact portion, so that the micro convex lenses 15 are also fixed to the inner peripheral side surface of the hole 11 through the filling portion 13.

On a surface of the multi-layer substrate section 30, an optical wave guide 47 is extended for each of the micro convex lenses 15 in such a manner that the optical waveguides 47 cross the intersection position of optical axis 56 of the micro convex lens 15.

In positions where the optical waveguides 47 intersect the optical axes 56 of the micro convex lenses 15, a reflector 49 is provided for each of the optical waveguides 47.

The optical waveguides 47 are located in the planes which are parallel to each other including the same plane. When an optical signal is transmitted in each of optical waveguide 47 and enters a reflector 49, the optical signal is reflected from a direction substantially perpendicular to the plane where the optical waveguide 47 is located. In contrast, when an optical signal enters a reflector 49 in a direction substantially perpendicular to a plane where the optical wave guide 47 is located, the optical signal is reflected in a direction substantially perpendicular in order to guide the optical signal to the inside of the optical waveguide 47.

The refractive index of a constituent material of the optical condensing portion 12, particularly the micro convex lenses 15 is larger than that of a constituent material of the filling portion 13, and the micro convex lenses 15 have a shape near a hemisphere which is thick in the middle and thinner nearer the outer periphery than the middle. Portion swelling thick is in close contact with the filling portion. Thus, both of an optical signal entering the filling portion 13 through the micro convex lens 15 and an optical signal entering the micro convex lens 15 through the filling portion 13 are condensed.

The micro convex lens 15 is located in the traveling direction of an optical signal reflected in a direction substantially perpendicular to a plane where the optical waveguide 47 is located, and the reflected optical signal enters the micro convex lens 15 in parallel with the optical axis 56, is condensed, and is released to the outside of the multi-layer substrate section 30 through the filling portion 13.

In contrast, an optical signal passes through the filling portion 13 and enters a micro convex lens 15 in parallel with the optical axis 56. In the traveling direction of the optical signal condensed by the micro convex lens 15, the reflector 49 is located. When the condensed optical signal enters the reflector 49 in a direction substantially perpendicular to a plane where the optical waveguide 47 is located, it is reflected almost vertically and guided into the optical waveguide 47.

On the optical and electrical circuit board 1a of the present invention (and below-mentioned optical and electrical circuit boards 1b to 1d), various electrical or optical components and substrates can be mounted.

Figure 10A:
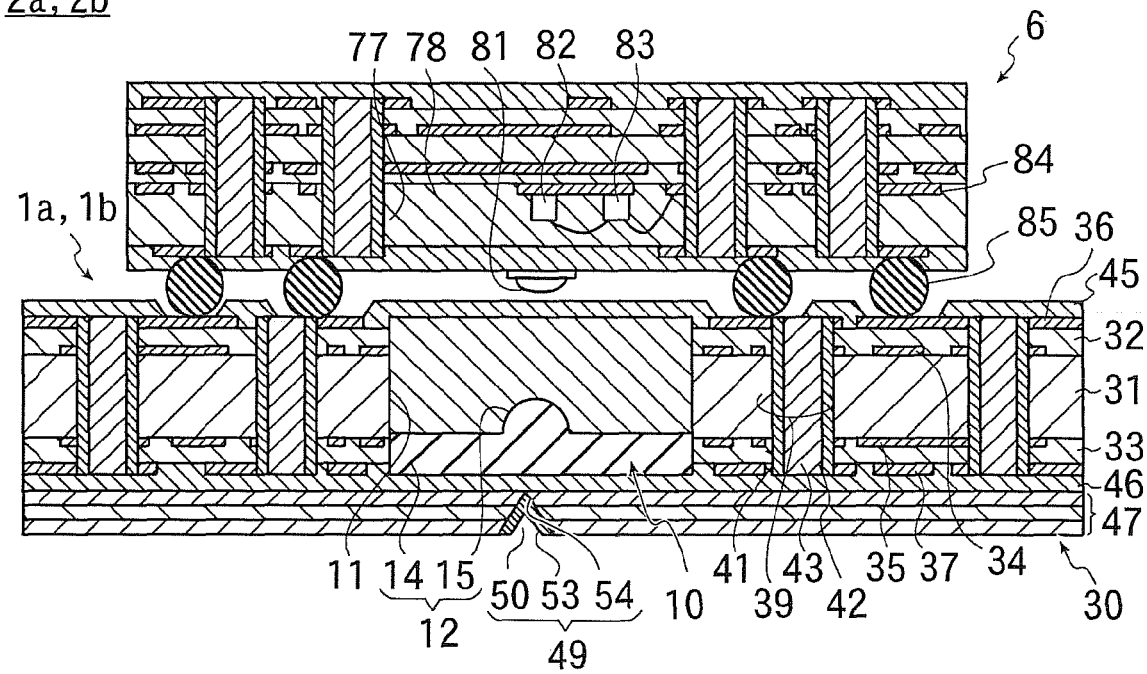
FIG. 10A illustrates the state that an example of an optical-electrical signals conversion substrate is mounted on the optical and electrical circuit board of the first embodiment or the second embodiment.
Figure 10B:
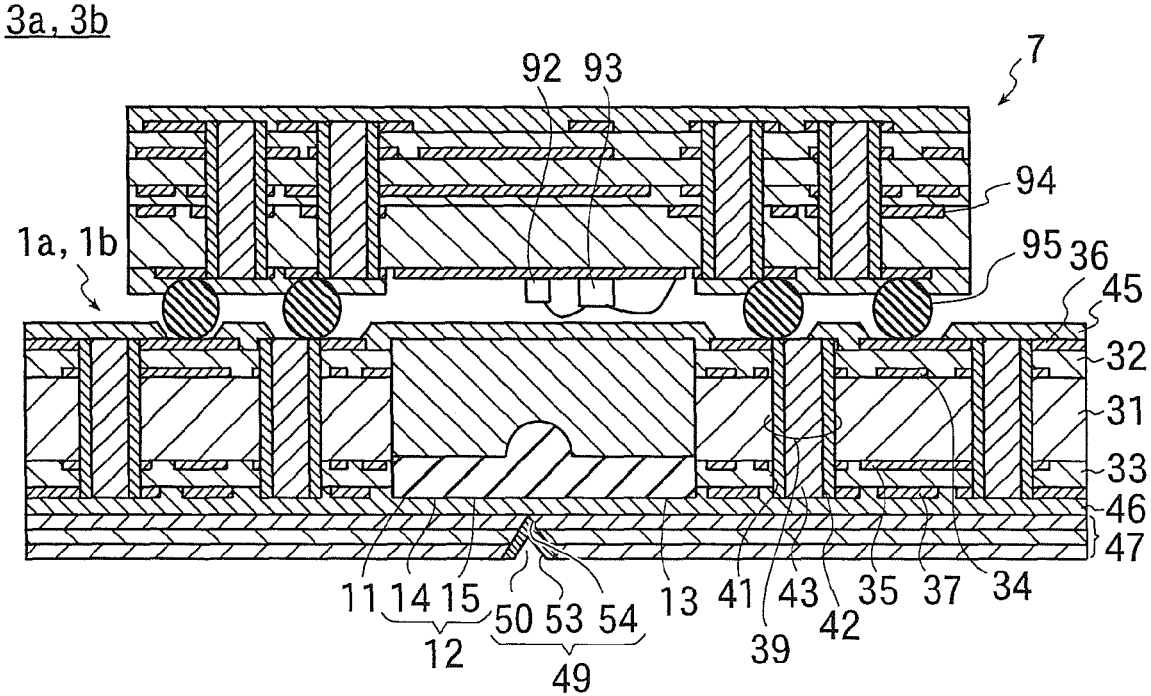
FIG. 10B illustrates the state that another example of an optical-electrical signals conversion substrate is mounted on the optical and electrical circuit board of the first embodiment or the second embodiment.

The reference numerals 2a, 3a in FIGS. 10A and 10B denote an optical and electrical circuit board on which an optical-electrical signals conversion substrate 6, 7 is mounted.

The optical-electrical signals conversion substrate 6, 7 has light-emitting/receiving elements 92 and 92, respectively. Inside the optical-electrical signals conversion substrate 6, 7 and/or on a surface thereof, patterned wiring layers 94 and 94 are disposed. The light-emitting/receiving elements 82 and 92 are connected with the wiring layers 84 and 94, and electrical signals can be transmitted between the light-emitting/receiving elements 82 and 92 and electronic components such as driver ICs (or amplifier ICs) 83 and 93.

First, in FIG. 10A, the optical-electrical signals conversion substrate 6 has a recess 77 inside thereof, and the light-emitting/receiving elements 82 are disposed in the recess 77.

The optical-electrical signals conversion substrate 6 is disposed in such a manner that the light-receiving elements 82 are located on the extension lines of the optical axes 56 of the micro convex lenses 15.

The optical-electrical signals conversion substrate 6 has convex lenses 81, which are disposed just above the light-emitting/receiving elements 82. Inside of the recess 77 is filled with filling material 78 transparent to an optical signal.

When a light-emitting/receiving element 82 operates as a light-receiving element, an optical signal which has been transmitted in an optical waveguide 47 in the optical and electrical circuit board 1a and reflected by the reflector 49 is condensed by an optical condensing portion 12 and a convex lens 81, enters the light-emitting/receiving element 82, and then is converted to an electrical signal.

When a light-emitting/receiving element 82 operates as a light-emitting element, an electrical signal input from the wiring layer 84 is converted to an optical signal and transmitted by the light-emitting/receiving element 82. The optical, signal output from the light-emitting/receiving element 82 is condensed by a convex lens 81 and the optical condensing portion 12 and reflected by the reflector 49 to be guided into the optical waveguide 47.

A micro convex lens 15 is disposed for each of the light-emitting/receiving elements 82, and an optical signal transmitted from each of the light-emitting/receiving elements 82 is condensed by the micro convex lens 15.

The optical-electrical signals conversion substrate 7 in FIG. 10B has no depression 77 or convex lens 81, and light-emitting/receiving elements 92 and driver ICs 93 are exposed on a surface thereof. However, operations of transmitting and receiving an optical signal are equivalent to those in the case of FIG. 10A.

The wiring layer 36 of the optical and electrical circuit board 1a is electrically connected with the wiring layers 84, 94 of the optical-electrical signals conversion substrate 67 through conductive bumps 85, 95. Between the optical-electrical signals conversion substrate 6, 7 and the optical and electrical circuit board 1a, an optical signal is transmitted unidirectionally or bi-directionally through the lens section 10, but an electrical signal is transmitted unidirectinally or bi-directinally through the bumps 85, 95.

Protection layers 45 and 46 are disposed on the surface of the optical and electrical circuit board 1a and between the lens section 10 and the optical waveguides 47, and the protection layers 45, 46 are transparent to an optical signal, thus not interfering with transmission of an optical signal.

Furthermore, electronic components such as semiconductor elements and capacitors may also be mounted on the optical and electrical circuit board 1a in order to constitute electronic circuits.

The process of manufacturing an optical and electrical circuit board 1a as described above will be described.

First, as shown in FIG. 1A, an object 101 to be processed having wiring layers 34 and 35 and insulating layers 32 and 33 disposed in this order on both sides of a base layer 31 and metal layers 51 and 52 disposed on the surfaces of the insulating layers 32 and 33 is prepared. FIG. 1A and below-mentioned figures are partial cross-sectional views.

In the object 101 to be processed of FIG. 1A, through-holes 41 have been previously bored in predetermined locations, interlayer connecting layers 42 have been disposed on the inner peripheral side surfaces of the through-holes 41, and resin filler 43 is disposed in spaces surrounded by the interlayer connecting layers 42.

The through-holes 41 also penetrate metal layers 51 and 52, and the interlayer connecting layers 42 are in contact and electrically connected with the metal layers 51 and 52 exposed in the through-holes 41 at the upper and lower ends of the through-holes 41. Therefore, as described later, when the metal layers 51 and 52 are patterned to form wiring layers 36 and 37, the interlayer connecting layers 42 and the wiring layers 36 and 37 which are in contact therewith, are electrically connected with each other.

The through-holes 41 also penetrate the wiring layers 34 and 35 on the base layer 31, and as similar to the case of the metal layers 51 and 52, the interlayer connecting layers 42 are in contact and electrically connected with the wiring layers 34 and 35 exposed to the inner peripheral surfaces of the through-holes 41. As a result, the wiring layers 34 to 37 in different layers are electrically connected with one another through the interlayer connecting layers 42.

Figure 1B:
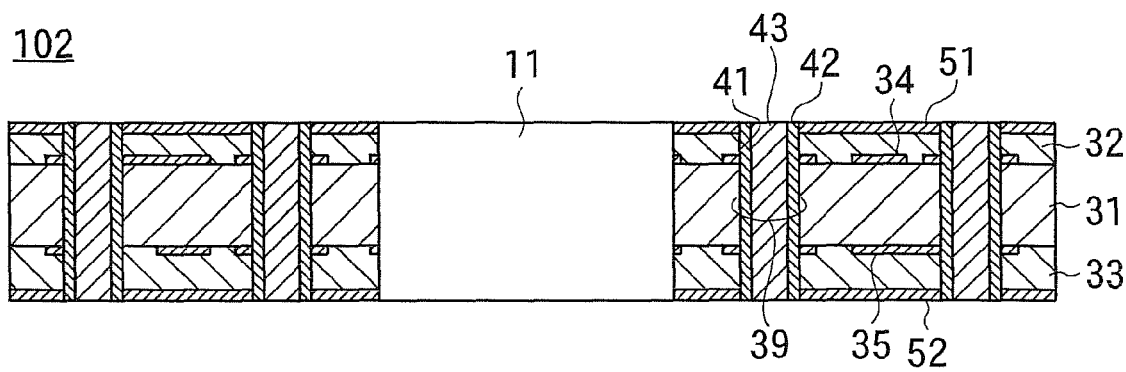

Next, as shown in FIG. 1B, a large-diameter hole 11 penetrating the object 101 to be processed in the thickness direction thereof is formed.

Figure 1C:
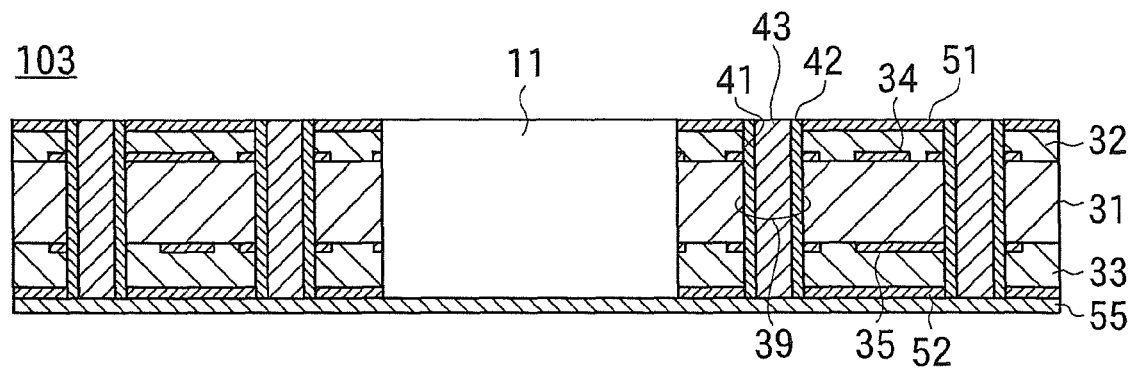

In an object 102 to be processed in this state, both ends of the hole 11 are opened. Next, as shown in FIG. 1C, when a supporting film 55 is adhered on one side of a substrate 102 to be processed, one end of the hole 11 is closed with the supporting film 55, and a substrate 103 to be processed having a vessel-like space opened at the other end is obtained.

In advance, first photoreactive material made of liquid photo-curing material which becomes the material of micro convex lenses 15 has been prepared. The object 103 to be processed is disposed in such a manner that the supporting film 55 faces vertically downward and the open end of the hole 11 faces vertically upward, and liquid first photoreactive material is injected into the hole 11. For the first photoreactive material and below-mentioned second photoreactive material, organic material is used herein, but inorganic material, photo-curing material, or photodissolution material may be used. Furthermore, also for the first and second filling material, organic material is used, but inorganic material may be used.

Figure 2A:
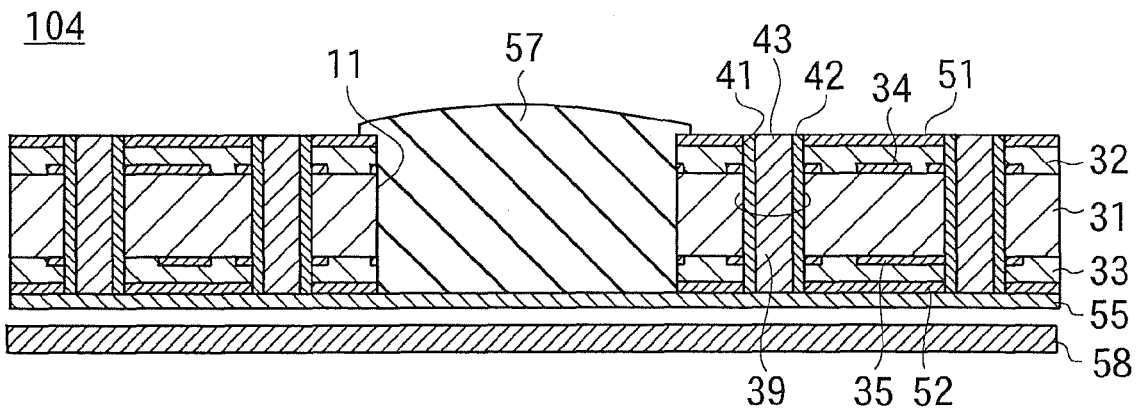
FIGS. 2A to 2C illustrate the process of manufacturing the optical and electrical circuit board of the first embodiment of the present invention.

The reference numeral 104 in FIG. 2A denotes an object to be processed in the above state. Since the bottom face of the hole 11 is closed with the supporting film 55 which is fluid-tight, the first photoreactive material 57 does not leak from the inside of the hole 11.

Figure 2B:
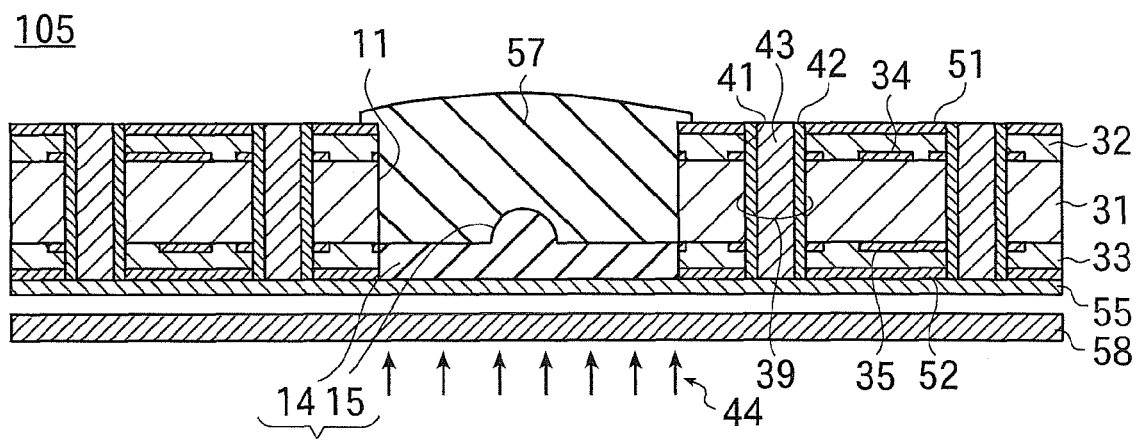

A mask 58 is disposed under the object 104 to be processed and near the supporting film 55, and exposure light 44 is irradiated to the mask 58 as shown in FIG. 2B.

Since the mask 58 has light-shielding portions described later so as to partially pass the exposure light 44, and the supporting film 55 is transparent to the exposure light 44, the exposure light 44 which has passed through the mask 58 and the supporting film 55 enters the first photoreactive material 57.

The first photoreactive material 57 is resin cured when irradiated with the exposure light 44. The exposure light 44 having an irradiation shape corresponding to the pattern of the mask 58 is irradiated, so that the first photoreactive material 57 is cured to form an optical condensing portion 12 constituted by the cured portion corresponding to the pattern of the mask 58.

The reference numeral 105 in FIG. 2B denotes an object to be processed in the state that the optical condensing portion 12 has been formed.

In the present invention, the exposure light is ultraviolet light, visible light, electron beams or the like and widely includes electromagnetic wave and particle beams which cure the first photoreactive material (or below-mentioned second photoreactive material) to form a shape corresponding to the pattern of a mask.

Figure 12A:
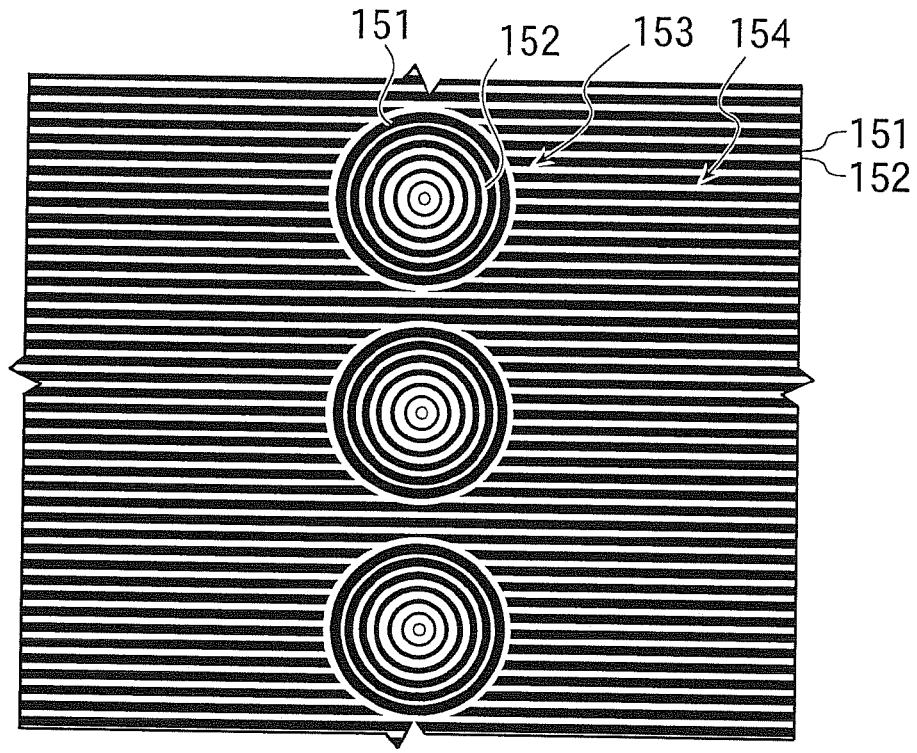
FIG. 12A shows an example of a mask for forming micro convex lenses.

The mask 58 used in this embodiment is a pattern as shown in FIG. 12A and has light-shielding portions 151 shielding the exposure light 44 arranged in a predetermined pattern on a glass substrate. There are light-passing portions 152 where the exposure light 44 passes through, between the light-shielding portions 151.

The mask 58 has a plurality of lens patterns 153 having the circular light-shielding portions 151 and the circular light-passing portions 152 arranged alternately and concentrically, and a light attenuation pattern 154 which is arranged around each of the lens patterns and has linear light-shielding portions 151 and linear light-passing portions 152 arranged alternately.

The area ratio of the light-passing portions 152 to the light-shielding portions 151 in the light attenuation pattern 154 of the mask 58 is set to be less than the area ratio of the light-passing portions 152 to the light-shielding portions 151 in the lens patterns 153 of the mask 53, so that the amount of exposure light 44 which has passed through the light attenuation pattern 154 is less than the amount of exposure light 44 which is passed through the lens patterns 153.

In the lens patterns 153 of the mask 58, the widths of the light-passing portions 152 are set to be larger nearer to the centers of concentric circles, and the widths of the light-shielding portions are set to be larger nearer to the outermost periphery of the concentric circles. Thus, the area ratio of the light-passing portions 152 to the light-shielding portions 151 in the lens patterns 153 becomes larger nearer to the centers of the concentric circles and smaller nearer to the outer peripheries of the concentric circles.

According to the area ratio described above, the amount of exposure light 44 which has passed through the mask 58 is small at the light-passing portions of the light attenuation pattern 154 and increases nearer to the center of each of the lens patterns 153, so that the amount of exposure light 44 which has passed through locations near the centers of the lens patterns 153 is larger than that of exposure light 44 which has passed through the light attenuation pattern 154, and the exposure light 44 which has passed through locations near the centers of the lens patterns 153 reaches deep portions of the first photoreactive material 57.

As a result, as shown in FIG. 2B, portions to which the exposure light 44 passed through the lens patterns 153 is irradiated, are cured in the form of a convex lens which is thick in the middle, and these portions form micro convex lenses 15.

The same amount of exposure light 44 which has passed through the light attenuation pattern 154 reaches portions around the micro convex lenses 15 and the portions are cured evenly. As a result, a supporting portion 14 shaped like a board having a constant thickness which is thinner than the micro convex lenses 15 is formed, and the micro convex lenses 15 and the supporting portion 14 constitute the optical condensing portion 12.

The supporting portion 14 is in contact and fixed with the inner peripheral surface of the hole 11, and the micro convex lenses 15 are fixed in the hole 11 by the supporting portion 14. In the state of FIG. 2B, the micro convex lenses 15 are also fixed on the supporting film 55.

As for an amount of the exposure light 44 passed through the mask 58, even exposure light passed through the centers of the lens patterns 153 is set to have the light amount less than that curing the first photoreactive material 57 totally in the depth direction, so that uncured first photoreactive material 57 is remained on the optical condensing portion 12.

Figure 2C:
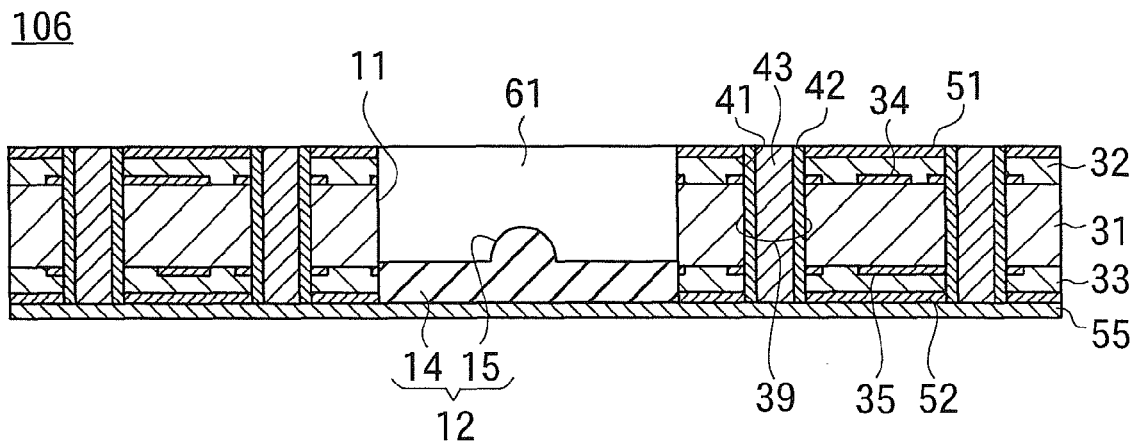

When the object 105 to be processed in this state is washed to remove the uncured first photoreactive material 57, a substrate 106 to be processed having a cavity 61 formed on the optical condensing portion 12 in the hole 11 is obtained as shown in FIG. 2C.

Figure 3A:
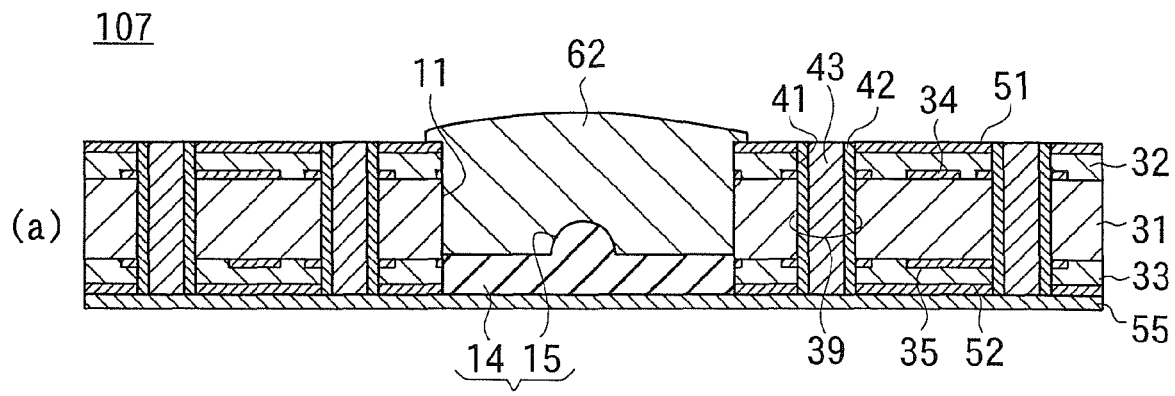
FIGS. 3A to 3C illustrate the process of manufacturing the optical and electrical circuit board of the first embodiment of the present invention.
Figure 3B:
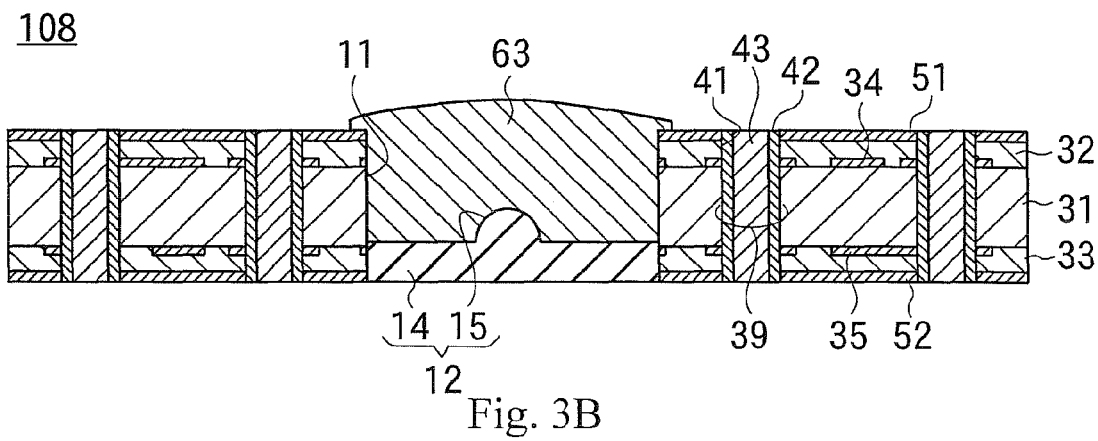

Next, as shown in FIG. 3A, liquid first filling material 62 is injected into the cavity 61.

When the hole 11 has been closed by the optical condensing portion 12, the first filling material 62 does not leak even if the supporting film 55 has been removed. However, when the hole 11 has not been closed by the optical condensing portion 12, the supporting film 55 is not removed to be remained and the bottom face of the hole 11 is closed by the supporting film 55.

In either case, as shown in FIG. 3A, an object 107 to be processed having the cavity 61 filled with the first filling material 62 is formed. The first filling material 62 is disposed in the hole to the extent that it protrudes from the surface of the object 107 to be processed.

When the first filling material 62 is cured in this state, cured material 63 of the first filling material 62 is formed on the optical condensing portion 12 in the hole 11.

The first filling material 62 may have any curability including thermosetting property and photo-curability, but the cured material 63 needs to be transparent to an optical signal.

The bottom face of the cured material 63 is in close contact with the optical condensing portion 12, and the top of it protrudes upward from the surface of the object 108 to be processed.

Figure 3C:
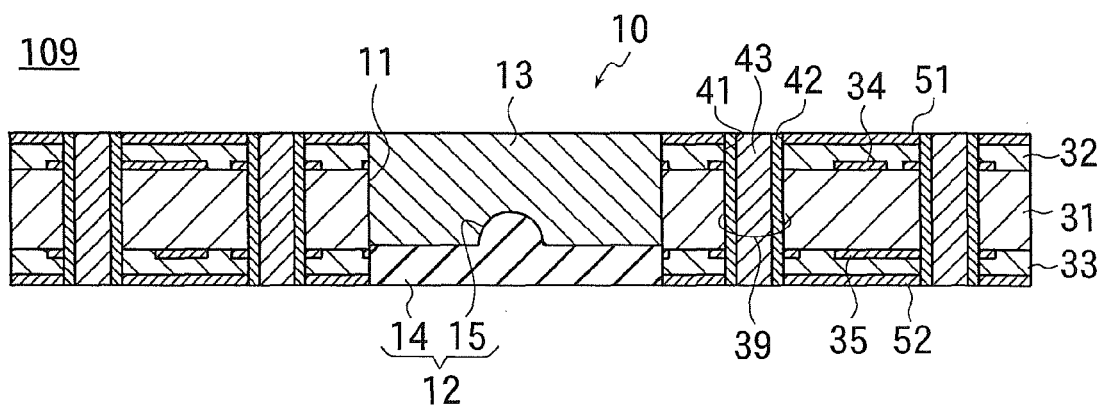

Next, when the surface of the object 108 to be processed having the cured material 63 is grinded to remove the portion of the cured material 63 protruding from the surface of the object 108 to be processed, an object 109 to be processed in which a filling portion 13 having a plane surface is disposed on the optical condensing portion 12 in the hole 11 is obtained as shown in FIG. 3C.

The filling portion 13 and the optical condensing portion 12 are in close contact with each other, and constitute a lens section 10. Since the bottom faces of the micro convex lenses 15 and the bottom face of the supporting portion 14 are flat, an optical signal almost vertically irradiated to the lens section 10 enters the inside thereof vertically.

Furthermore, since the surface of the lens section 10 is flat, the irradiated optical signal enters the inside of the lens section 10 without being scattered and is output to the outside of the lens section 10 without being dispersed.

The refractive index of material consisting of the filling portion 13 (cured first filling material) is less than that of material consisting of the micro convex lenses 15 (cured first photoreactive material), and an optical signal passing through any one of the micro convex lenses 15 is condensed by the micro convex lens 15, as described above.

In this embodiment and below-mentioned embodiments, it is desirable that the refractive index of the micro convex lens 15 be 1.05 or more times larger than the refractive index of the filling portion 13. As an example, the micro convex lens 15 may be made of epoxy resin having the refractive index of 1.584, and the filling portion 13 may be made of epoxy resin having the refractive index of 1.448.

Resin consisting of the micro convex lenses 15 and resin consisting of the filling portion 13 need to be transparent to an optical signal and have refractive indexes satisfying the above relation, and may be various resin such as silicon resin and acrylic resin in addition to epoxy resin.

Figure 4A:
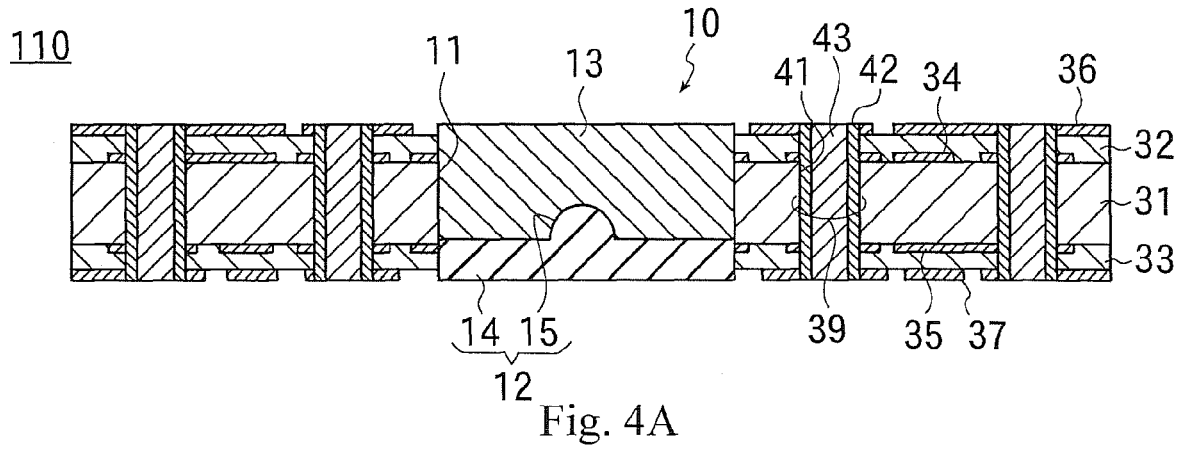
FIGS. 4A to 4C illustrate the process of manufacturing the optical and electrical circuit board of the first embodiment of the present invention.

The supporting film 55 may be removed before or after polishing the filling material 63. After removing the supporting film 55, the metal films 51 and 52 are patterned to obtain an object 110 to be processed having wiring layers 36 and 37 on the insulating layers 32 and 33 as shown in FIG. 4A.

Figure 4B:
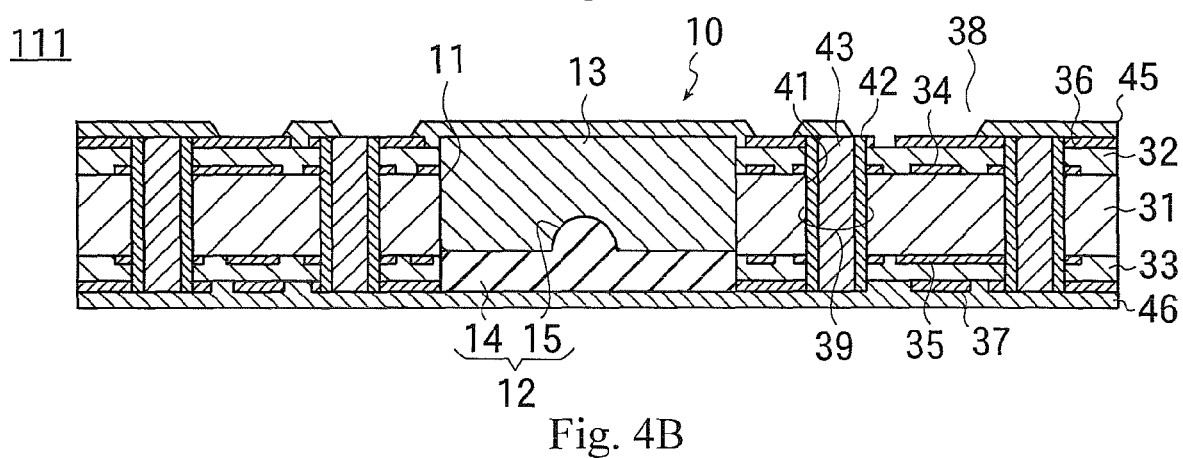

Next, resin layers are formed on the object 110 to be processed and patterned to obtain an object 111 to be processed having protection layers (solder resist films) 45 and 46 which are the resin layers as shown in FIG. 4B.

In the protection layer 45 or 46, openings 38 are formed at predetermined locations, and the surface of the outermost wiring layer 36 or 37 is exposed to the bottom face of the openings 38. The outermost wiring layer 36 or 37 is covered at portions other than the opening 38.

Figure 4C:
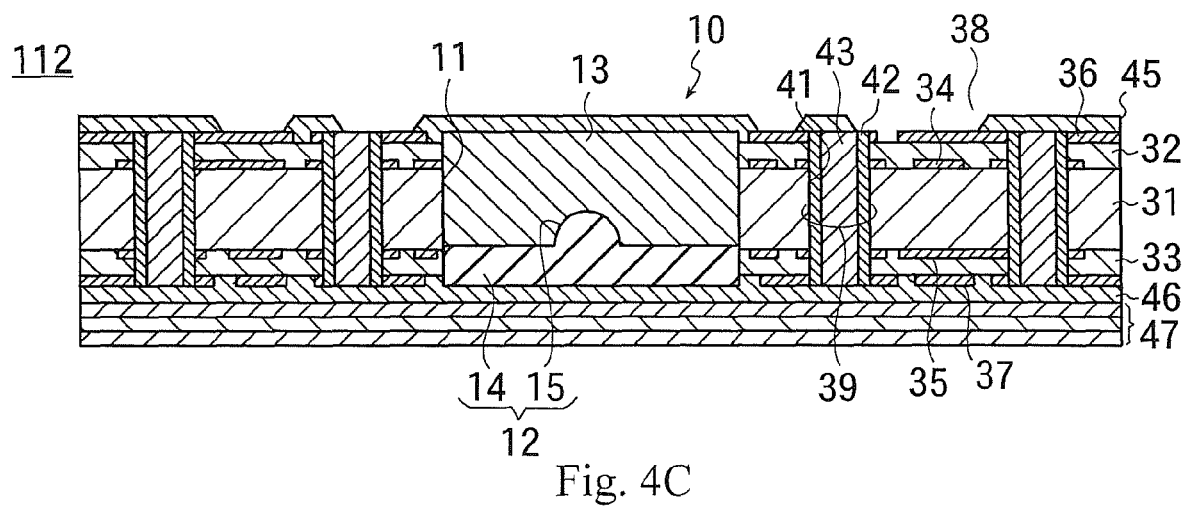

Next, optical waveguides are adhered on one side of the object 111 to be processed. Here, as shown in FIG. 4C, optical waveguides 47 in three layers are attached on a side on which the optical condensing portion 12 is located. The object 112 to be processed is cut by a dicing device or the like to form notch 50, which have surface 54 inclined about 45 degrees to the optical waveguides 47, in portions of the optical waveguides 47 on the extension lines of the optical axes 56 of the micro convex lenses 15.

After the object 113 to be processed in this state is brought into a film deposition apparatus and metal layer is formed on one side of the object 113 to be processed including the inside of the notch 50 and the surfaces of the optical waveguides 47, and the metal layers outside the notch 50 is removed. At that time, as shown in FIG. 5B, reflecting layer 53 which is a metal layer remained on the inclined surfaces 54 of the notch 50, is formed, and the optical and electrical circuit board 1a of the first embodiment of the present invention is obtained.

The reference numeral 49 in this figure denotes a reflector constituted by a notch 50, the inclined surface 54 thereof, and a reflecting layer 53. An optical signal input from a micro convex lens 15 to a reflector 49 or an optical signal input from an optical waveguide 47 to a reflector 49 is reflected not by the surface but by the bottom face of the reflecting layer 53, and the traveling direction of the optical signal is changed about 90 degrees.

In the optical and electrical circuit board 1a of the first embodiment, the micro convex lenses 15 are fixed in the hole 11 by the supporting portion 14. However, the optical and electrical circuit board 1a of the present invention does not necessarily need to have the supporting portion 4.

For example, after the object 104 to be processed in which the hole 11 closed by the supporting film 55 at the bottom face is filled with the first photoreactive material 57 has been obtained, the first photoreactive material 57 is exposed to light through a mask having a pattern by which the supporting portion 14 is not formed and is different from the above-described mask 58.

Figure 6A:
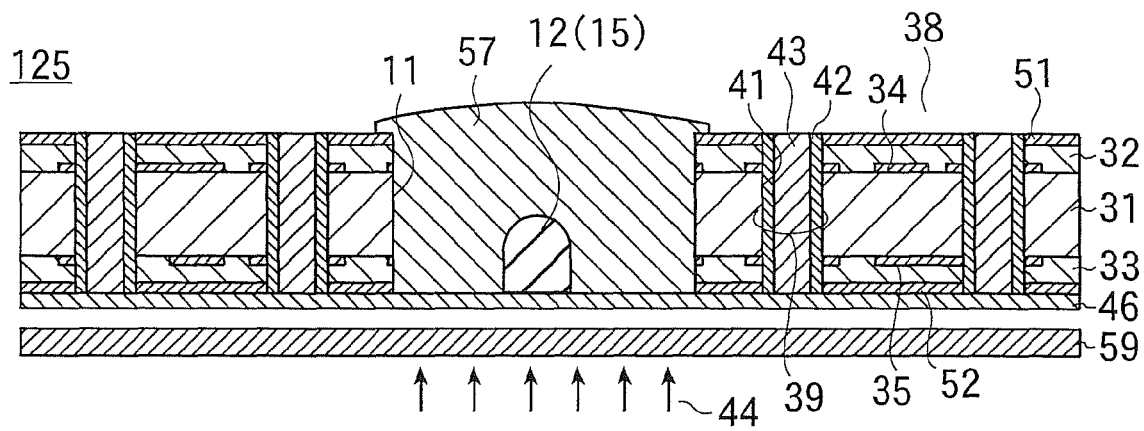
FIGS. 6A and 6B illustrate a process of manufacturing the optical and electrical circuit board of a variation of the present invention.
Figure 12B:
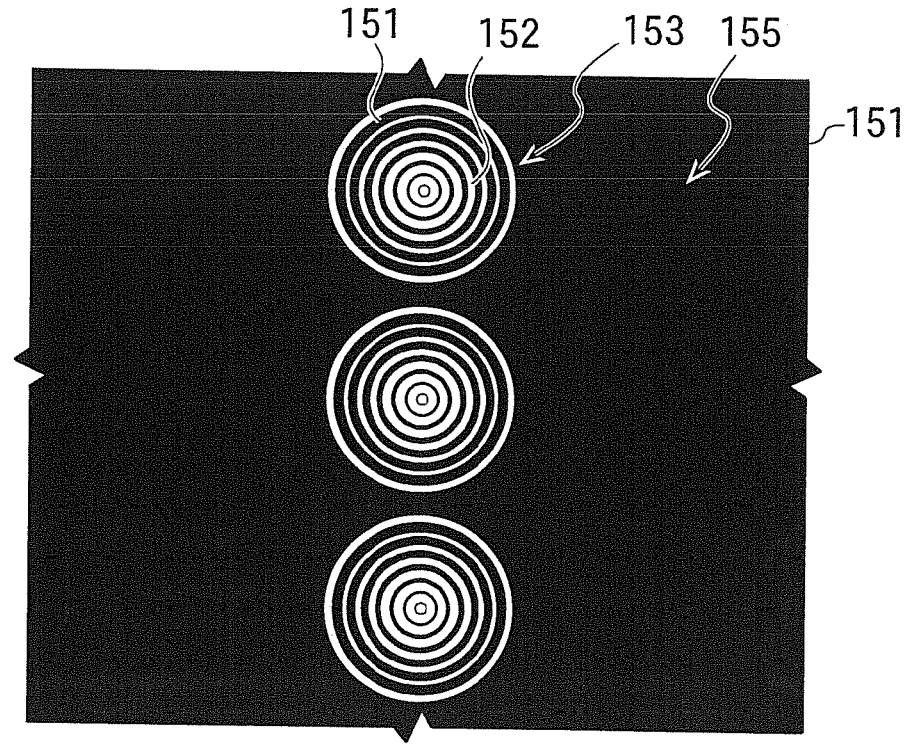
FIG. 12B shows another example of a mask for forming micro convex lenses.

For example, the mask 59 in FIG. 12B has the same lens patterns 153, and a light-shielding pattern 155 constituted by light-shielding portions 151 is disposed outside the lens patterns 153. Thus, exposure light 44 does not pass through the outside of the lens patterns 153. When exposure light which has passed through the mask 59 is irradiated to the first photoreactive material 57 and the portions to which exposure light is irradiated are cured, isolated micro convex lenses 15 having no supporting portion are formed as shown in FIG. 6A.

The micro convex lenses 15 are fixed on the a supporting film 46, but the hole 11 around the micro convex lenses 15 is filled with uncured first photoreactive material 57, so that the micro convex lenses 15 are not fixed to the inner peripheral surface of the hole 11.

Figure 6B:
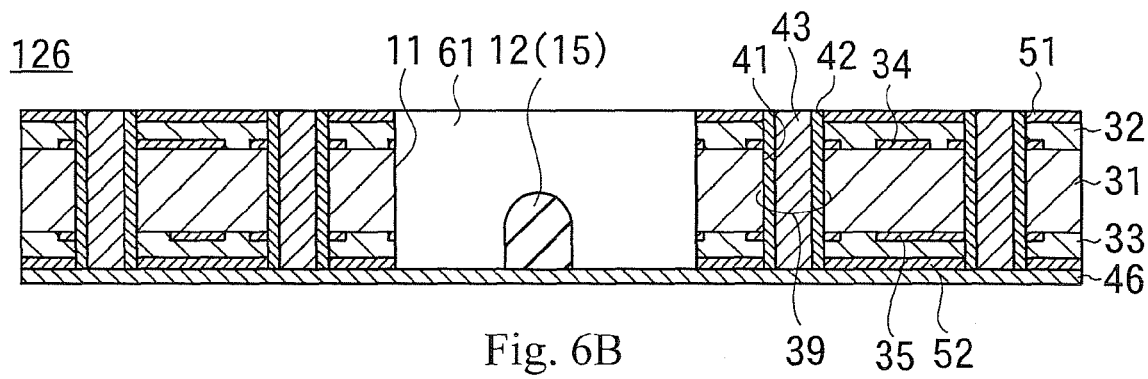

Next, when the object 125 to be processed is washed to remove the uncured first photoreactive material 57, an object 126 to be processed having the micro convex lenses 15 fixed on the supporting film 46 in the hole 11 is obtained as shown in FIG. 6B.

Figure 6C:
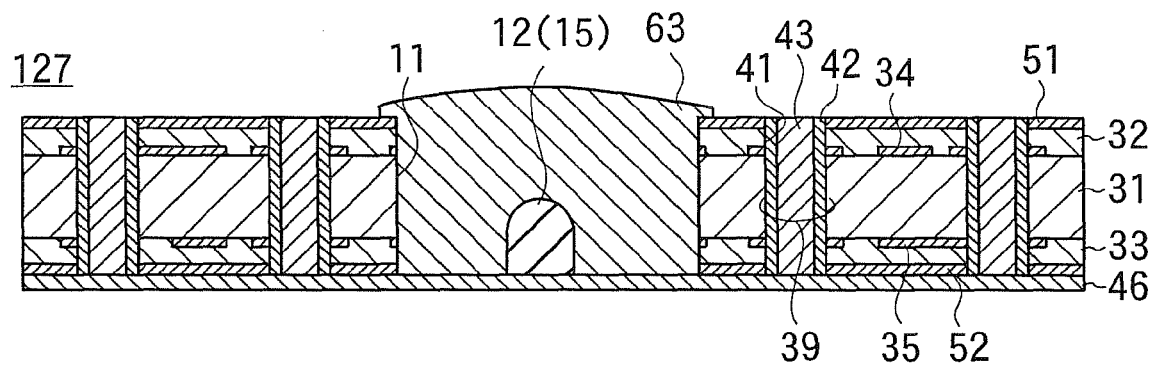
FIG. 6C shows a step of filling first filling material.

When first filling material is injected into the hole 11 of the object 126 to be processed to the extent that the surface of the first filling material protrudes and then, the first filling material is cured. An object 127 to be processed having cured first filling material 63 formed in the hole 11 is obtained as shown in FIG. 6C.

Figure 7A:
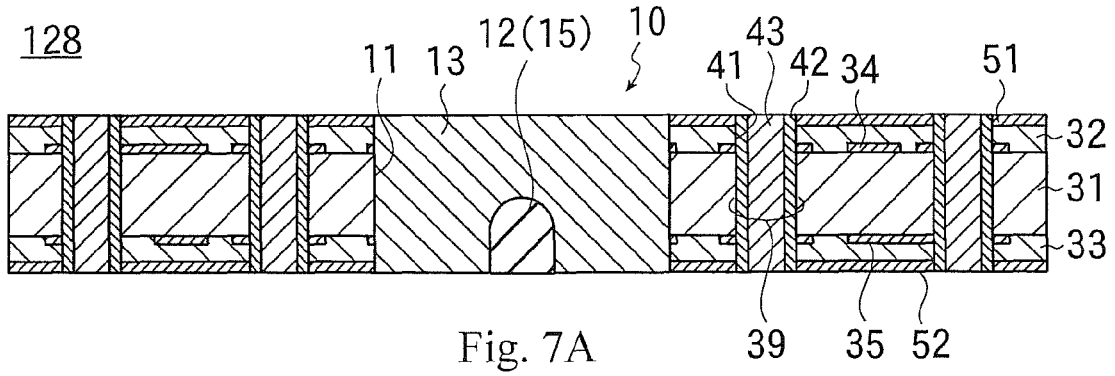
FIGS. 7A to 7C illustrate the process of manufacturing the optical and electrical circuit board of the variation of the present invention.
Figure 7B:
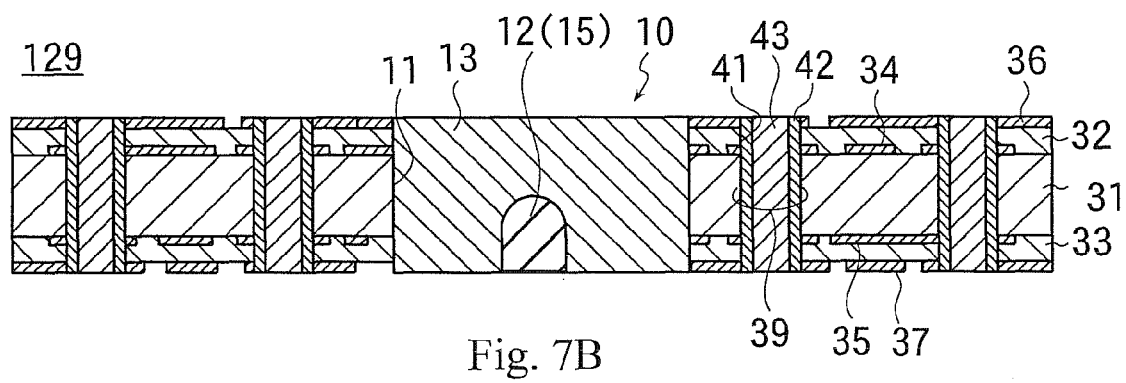

Next, when the portion of the cured material 63 protruding from the surface of the object 127 to be processed is grinded and removed by a grinder or the like to form a filling portion 13 having a plane surface, and the support film 46 is removed as shown in FIG. 7A, an object 128 to be processed is obtained. When the metal layers 51 and 52 of the object 128 to be processed are patterned, an object 129 to be processed having patterned wiring layers 36 and 37 as outermost layers is obtained.

After cured material 63 has been formed by curing the first filling material, the isolated micro convex lenses 15 are fixed to the inner peripheral surface of the hole 11 by the cured material 63, so that the micro convex lenses 15 do not drop out of the hole 11 even if the supporting film 46 has been removed.

Figure 7C:
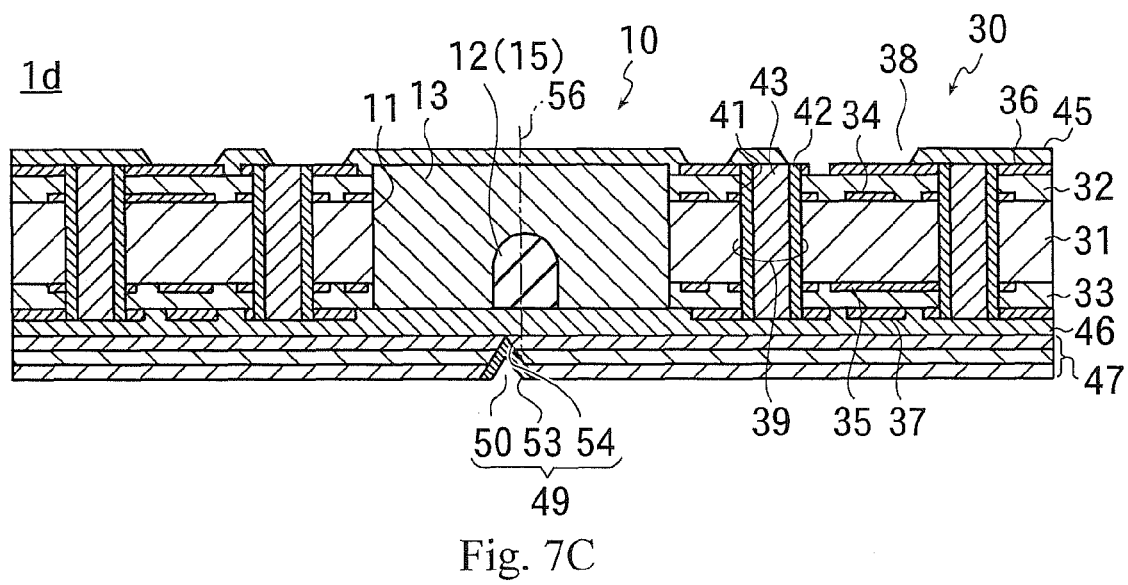

Next, as shown in FIG. 7C, when patterned protection layers 45 and 46 which are in close contact with the outermost wiring layers 36 and 37, are formed, and then, optical waveguides 47 are attached to the protection layer 46, and reflector 49 is formed, an optical and electrical circuit board 1d which is a variation of the embodiment of the present invention is obtained.

The optical and electrical circuit board 1d of this variation can be used instead of the optical and electrical circuit board 1a of the first embodiment (or the optical and electrical circuit board 1b of the second embodiment or the optical and electrical circuit board 1c of the third embodiment described later) to mount the optical-electrical signals conversion substrate 6, 7 in order to obtain an optical and electrical circuit board having the optical-electrical signals conversion substrate 6, 7.

In the above method, the micro convex lenses 15 are formed first and the filling portion 13 is formed next. However, the method of the present invention is not limited to this.

In the case that micro convex lenses 15 are disposed in the same locations as those of the first optical and electrical circuit board 1a of the first embodiment and the optical and electrical circuit board 1d of the variation, an object 102 to be processed having a hole 11 penetrating it in the thickness direction as shown in FIG. 1B is formed. Then, as shown in FIG. 8A, a supporting film is attached on a side opposite to a side on which a supporting film is attached when the optical and electrical circuit board 1a of the first embodiment or the optical and electrical circuit board 1d of the variation is formed.

Figure 8A:
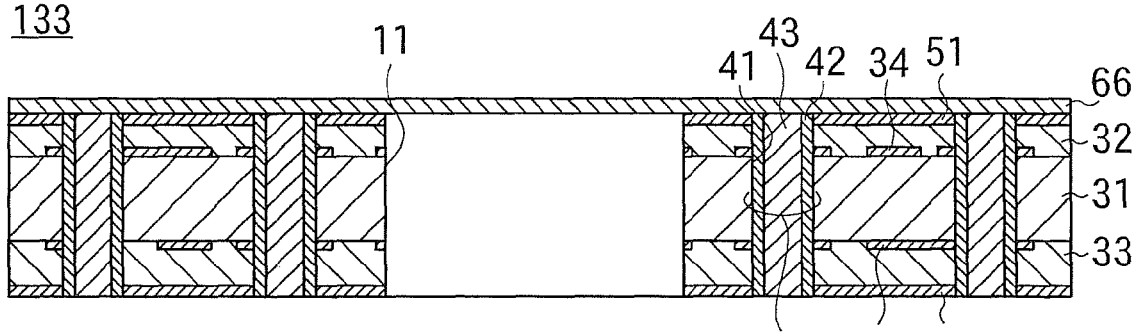
FIGS. 8A to 8C illustrate a process of manufacturing the optical and electrical circuit board of a second embodiment of the present invention.

The reference numeral 133 in FIG. 8A denotes an object to be processed in this state, and one end of the hole 11 is closed by a supporting film 66.

Figure 8B:
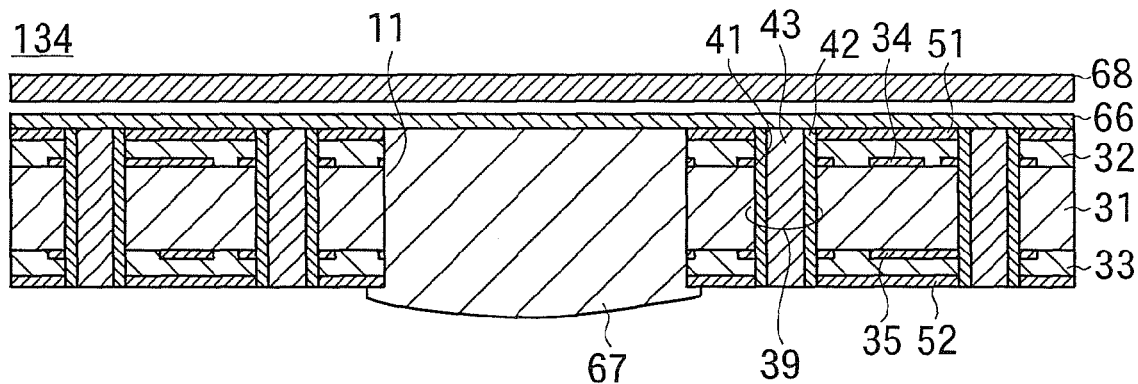

The object 133 to be processed is placed in such a manner that the supporting film 66 faces vertically downward and the opening end of the hole 11 faces vertically upward, and as shown in FIG. 8B, liquid second photoreactive material 67 is injected into the hole 11. For the second photoreactive material, photo-curing material is used.

In FIG. 8B, an object 134 to be processed is illustrated as upper part of the sheet shows vertical lower side and bottom part of the sheet shows vertical upper side, as in contrast to an object to be processed in FIG. 2A or FIG. 3A. At vertical downward and near the supporting film 66 of the object 134 to be processed having the second photoreactive material 64 disposed in the hole 11, a mask 6S is disposed, as shown in FIG. 8C, exposure light is irradiated to the mask 68.

The supporting film 66 is transmissive to exposure light 44. The exposure light 44 which has passed through the mask 68 and the supporting film 66 is irradiated to the photoreactive material 67 to form a filling portion 13 cured in a form corresponding to the pattern of the mask 68.

The mask 68 has a plurality of Concave lens patterns each having optical transmittance which is low in the middle and higher nearer to the outer periphery, arranged in a light attenuation pattern. When exposure light 44 which has passed through a lens pattern thereof is irradiated to the filling portion 13, a concave part 65 is formed in the filling portion 13. The filling portion has transparency to the optical signal.

Figure 8C:
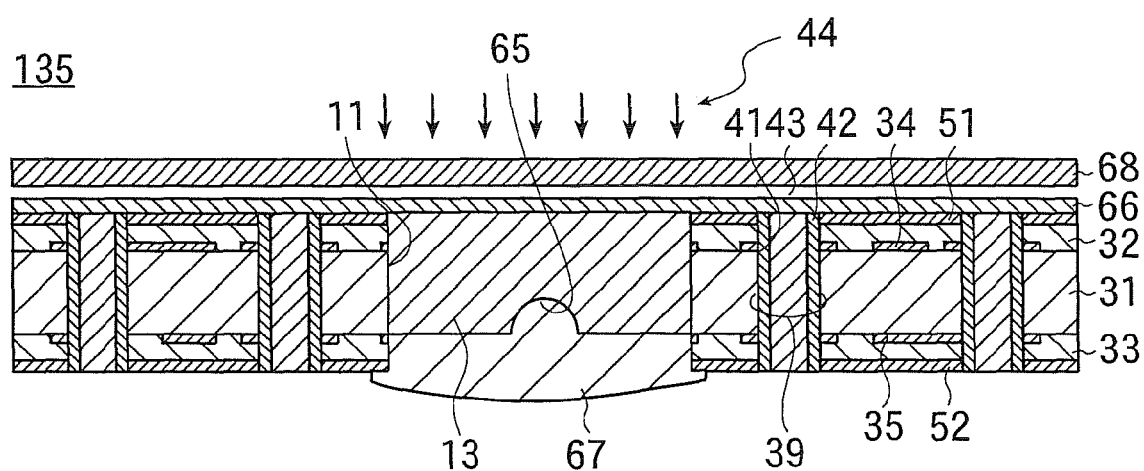

The reference numeral 135 shown in FIG. 8C denotes an object to be processed in the state that the filling portion 13 having concave parts 65 is formed, and uncured second photoreactive material 67 is remained on the filling portion 13.

Figure 9A:
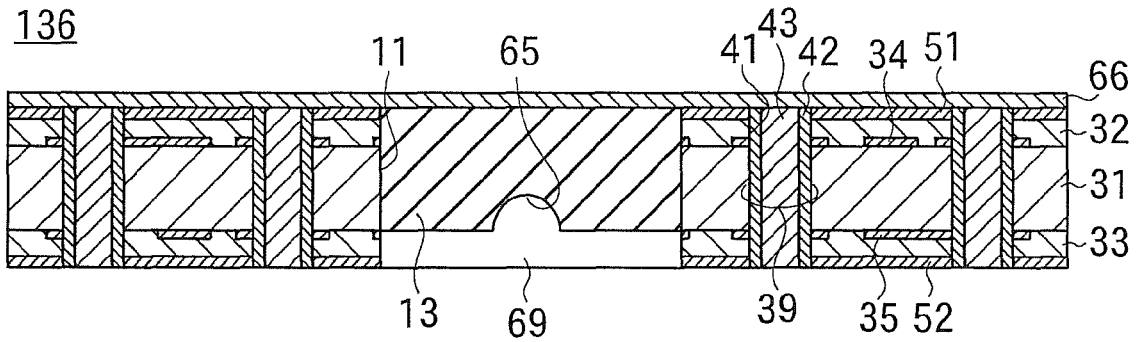
FIGS. 9A to 9C illustrate a process of manufacturing the optical and electrical circuit board of the second embodiment of the present invention.

Next, when the uncured second photoreactive material 67 is removed by washing, an object 136 to be processed having a cavity 69 on the filling portion 13 is obtained as shown in FIG. 9A.

The object 136 to be processed is placed in such a manner that the cavity 69 faces vertically upward and the filling portion 13 side faces vertically downward, and liquid second filling material is injected into the cavity 69 and is cured. The second filling material may have any curability including thermosetting property and photo-curability like the first filling material 62.

Figure 9B:
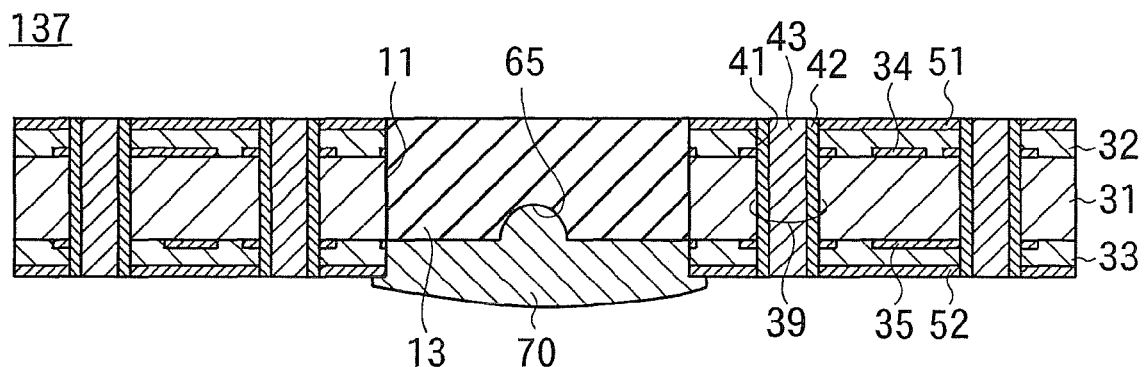

When the second filling material is filled until it protrudes higher than the surface of the object 137 to be processed and the second filling material is cured, an object 137 to be processed having cured material 70 having the surface of which has protruded is obtained as shown in FIG. 9B. The cured material 70 is transparent to an optical signal.

Figure 9C:
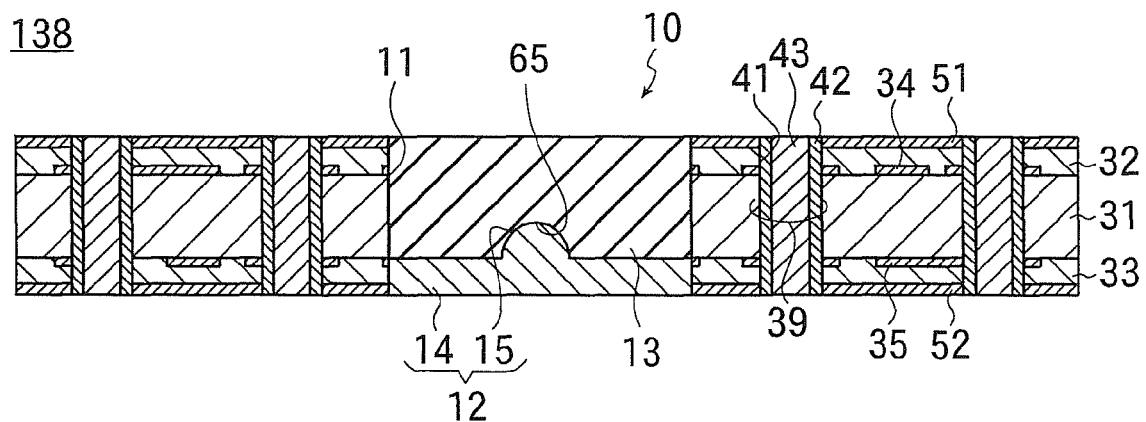

As shown in FIG. 9C, the protruded portion of the cured material 70 is grinded to be flattened by a grinder or the like to form an optical condensing portion 12 made of the cured second filling material 70.

Portions of the optical condensing portion 12 filled in the concave parts 65 of the filling portion 13 are each shaped like a convex lens to form micro convex lenses 15. On the other hand, a flat plane is formed around the concave parts 65 of the filling portion 13, and a portion of the optical condensing portion 12 located on the flat plane shapes a flat plate to form a supporting portion 14.

The optical condensing portion 12 is in close contact with the filling portion 13, and the micro convex lenses 15 are fixed inside the hole 11 by the filling portion 13 and the supporting portion 14.

The refractive index of the cured material 70 of the second filling material consisting of the micro convex lenses is larger than that of the cured material of the second photoreactive material consisting of the filling portion 13, so that light passing through the micro convex lenses 15 and the filling portion 13 is condensed at the boundaries between the micro convex lenses 15 and the filling portion 13.

According to the above process, a convex lens section 10 having a filling portion 13 made of the second photoreactive material and an optical condensing portion 12 made of the second filling material obtained by the above process has the same structure as that of a convex lens section 10 having an optical condensing portion made of the first photoreactive material 57 and a filling portion made of the first filling material 62, and after a convex lens section 10 has been formed, the optical and electrical circuit board 1b (FIG. 5B) of the second embodiment of the present invention is obtained by the same processing as shown in FIG. 4A to FIG. 5A for the objects 109 to 113 to be processed of the first embodiment.

As shown in FIG. 10, an optical-electrical signals conversion substrate 6, 7 is mounted on the optical and electrical circuit board 1b of the second embodiment as in the case of the optical and electrical circuit board 1a of the first embodiment to obtain an optical and electrical circuit board 2b, 3b.

In the optical and electrical circuit board 1a of the first embodiment, the optical condensing portion 12 is made of photo-curing material. However, in the optical and electrical circuit board 1b of the second embodiment, the optical condensing portion 12 may be made of thermosetting resin, photo-curing material, or any other curing resin.

In the optical and electrical circuit boards 1a and 1b described above, the optical condensing portion 12 is disposed between the filling portion 13 and the optical waveguides 47. However, the present invention is not limited thereto, and the filling portion 13 may be disposed between the optical condensing portion 12 and the optical waveguides 47 by disposing the supporting film 55, 66 on the other side.

Figure 11A:
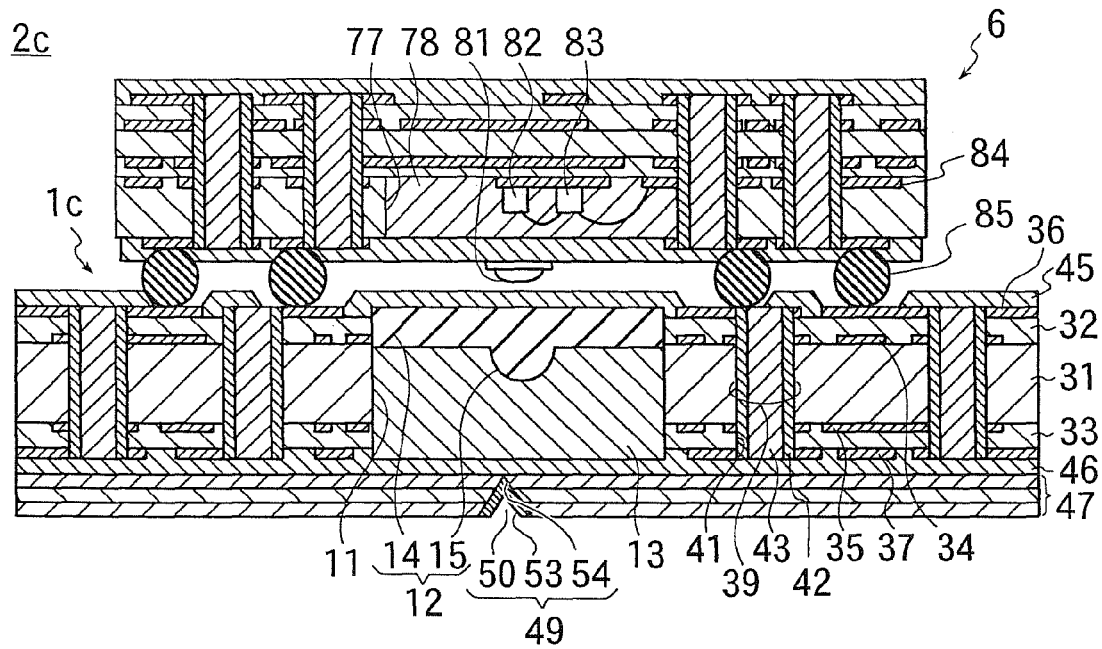
FIG. 11A illustrates the state that an example of an optical-electrical signals conversion substrate is mounted on the optical and electrical circuit board of the third embodiment.
Figure 11B:
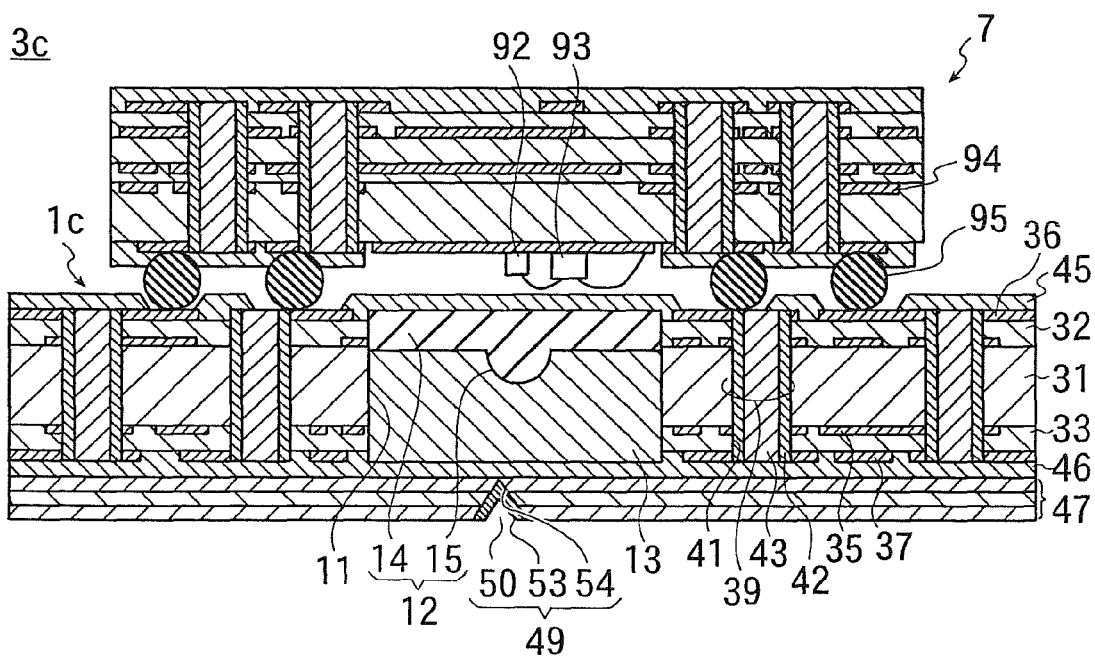
FIG. 11B illustrates the state that another example of an optical-electrical signals conversion substrate is mounted on the optical and electrical circuit board of the third embodiment.

The reference numeral 1c in FIGS. 11A and 11B denotes the optical and electrical circuit board of the third embodiment of the present invention having such a structure, and the reference numerals 2c, 3c denotes the optical and electrical circuit board on which the optical-electrical signals conversion substrate 6, 7 is mounted.

The optical and electrical circuit boards 1c to 3c have the same structures as those of the optical and electrical circuit boards 1a to 3a of the first embodiment or the optical and electrical circuit boards 1b to 3b of the second embodiment except that position of the optical condensing portion 12 and the filling portion 13 change in the hole 11.

In the optical and electrical circuit boards 1c to 3c of the third embodiment, an optical signal which has traveled in an optical waveguide 47 and has been reflected by a reflector 49, firstly passes through the filling portion 13 and is then condensed by a micro convex lens 15 to enter the optical-electrical signals conversion substrate 6, 7. In contrast, an optical signal output from the optical-electrical signals conversion substrate 6, 7 is condensed by a micro convex lens 15, passes through the filling portion 13, enters a reflector 49, and is guided inside the optical waveguide 47.

Also with respect to the optical condensing portion 12 of the second or the third embodiment of the optical and electrical circuit boards 1b to 3b or 1c to 3c, the micro convex lenses 15 may be fixed in the hole 11 by the filling portion 13 without providing a supporting portion 14 as in the case of the optical and electrical circuit board 1d of the variation.

Furthermore, electronic components such as, semiconductor elements is mounted also on the optical and electrical circuit boards 1c to 3c of the third embodiment as in the case of the optical and electrical circuit boards 1a to 3a of the first embodiment of the present invention or the optical and electrical circuit boards 1b to 3b of the second embodiment of the present invention.

In the above-described optical and electrical circuit boards 1a to 1c, 1b to 3b, and 1c to 3c, the portion of the holes 11 other than the optical condensing portion 12 can be filled with air without providing the filling portion 13 as long as the micro convex lenses 15 are fixed to the inner peripheral side surface of the hole 11 by the supporting portion 14.

The thickness of the supporting portion 14 and the thicknesses of the micro convex lenses 15 can be changed by changing the amount of exposure light 44 and/or the ratio between the light-shielding portions 151 and the light-passing portions 152 of the mask 58 and 59.

Furthermore, when the thickness of the supporting portion 14 and/or the thicknesses of the micro convex lenses 15 are changed, the distances between the micro convex lenses 15 and the light-emitting/receiving elements 82, 92 can be also changed.

Furthermore, the distances between the micro convex lenses 15 and the light-emitting/receiving elements 82, 92 can also be changed by changing the thickness of the multi-layer substrate section 30.

Although the first and second photoreactive material and the first and second filling material are liquid, they are not necessarily limited to liquid, and may be paste material or powder material as long as they can be disposed at a predetermined location in the hole 11.

Figure 13A:
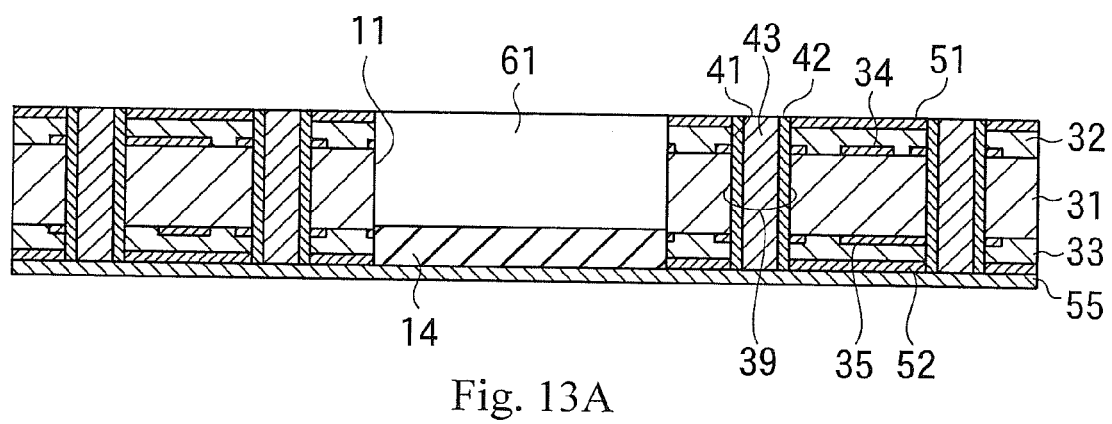
FIGS. 13A and 13B illustrate an example of forming a supporting portion and micro convex lenses by two or more exposure processes.
Figure 13B:
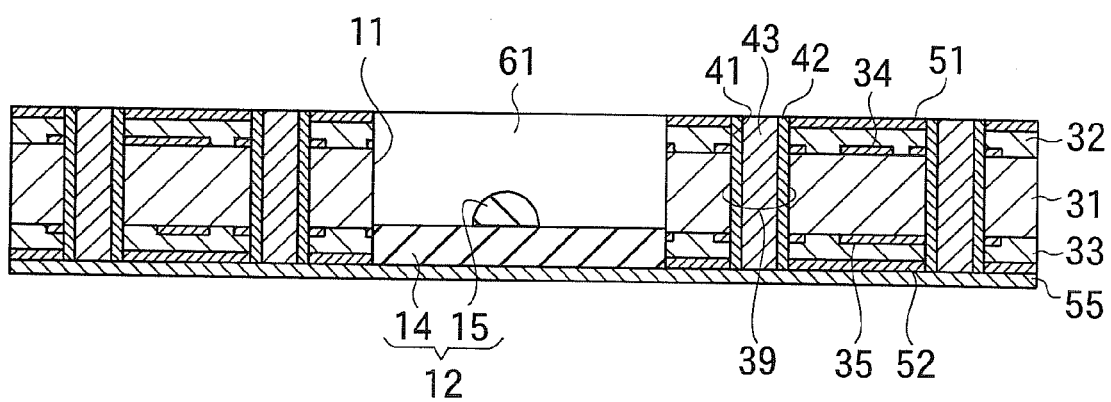

In the above embodiments, the optical condensing portion 12 is made of first photoreactive material in one exposure step, but may be formed in two or more steps. For example, first photoreactive material is exposed to light through a mask having no lens section to form a supporting portion 14 having no micro convex lens as shown in FIG. 13A, and the soluble portion thereof is then removed. After that, first photoreactive material is filled again and exposed to light to form micro convex lenses 15 on the supporting portion 14 as shown in FIG. 13B.

In the above description, the first or second photoreactive material is photo-curing material. However, the optical condensing portion 12 may be formed by using photodissolution material. When photodissolution material is used, portions to which exposure light is irradiated become soluble portion and portions to which exposure light is not irradiated become cured portion, so that when forming a component having the same shape as that in the case that photo-curing material is used, the pattern of a mask is reversed from that in the case that photo-curing material is used. In short, when the light-shielding portions in the case of photo-curing material are changed to light-passing portions and the light-passing portions in the case of photo-curing material are changed to light-shielding portions, an optical condensing portion and a filling portion can be formed in the same process as that in the case of photo-curing material. However, photo-curing material has more handling and cost advantages than photodissolution material.

The embodiments of the present invention is configured as described above, and when the photoreactive material is photo-curing material, a portion where exposure light has been irradiated is cured to become a cured portion, and a portion to which exposure light is not irradiated becomes a soluble portion. When the photoreactive material is photodissolution material, it is temporarily cured and then exposed using a mask. The portion to which exposure light has been irradiated becomes a soluble portion and a portion to which exposure light is not irradiated becomes a cured portion.

In the embodiments of the present invention, exposure light which has passed through a mask is irradiated to photoreactive material disposed in a hole of an object to be processed to form a cured portion and a soluble portion, and a micro convex lens is made of the photoreactive material, or, a filling portion having a depression part is made of photoreactive resin by exposure light which has passed through the mask and liquid filling material such as thermosetting resin is disposed in the depression part and is cured to form a micro lens.

It is easy to align an object to be processed with a mask, so that a micro convex lens can be disposed in an accurate position as compared with the case that a micro convex lens formed separately from the object to be processed is mounted.

Furthermore, a micro convex lens can be formed by an exposing and developing process similar to that of patterning a wiring layer, a protection layer, and the like in an object to be processed, so that the workability is high.

Furthermore, a micro convex lens is incorporated in an optical and electrical circuit board, so that the optical and electrical circuit board can be handled easily.

As mentioned above, preferred embodiments of the present invention have been described. However, the present invention is not limited to these embodiments, and variations and modifications may be made in accordance with the spirit and scope of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing an optical and electrical circuit board; the method comprising:
    providing a lens hole penetrating an object to be processed of which a first electrical wiring layer is arranged on both faces of a base layer, an insulating layer is formed on each of the first electrical wiring layers, and a second electrical wiring layer is formed on each of surfaces of the insulating layers, in a thickness direction thereof;
    providing a transparent supporting film on one face of the object to be processed so as to close one end of the lens hole;
    injecting a first photoreactive material into the lens hole from an opening at the other end of the lens hole;
    exposing exposure light to the first photoreactive material from the supporting film side;
    forming a cured portion and a soluble portion of the first photoreactive material by partially exposing the first photoreactive material to the exposure light passed through the supporting film; and then
    dissolving and removing the soluble portion of the first photoreactive material for development so as to form a micro convex lens in the lens hole.

2. The method of manufacturing an optical and electrical circuit board according to claim 1, further comprising:
    forming a cured portion in a region between a portion in which the micro convex lens is formed and an inner peripheral side surface of the lens hole, the cured portion constituting a connecting portion which connects the micro convex lens to the inner peripheral side surface of the lens hole.

3. The method of manufacturing an optical and electrical circuit board according to claim 1, further comprising:
    filling first filling material having optical transparency and a refractive index smaller than a refractive index of the micro convex lens into the lens hole in which the micro convex lens has been formed; and
    curing the first filling material to form a filling portion.

4. The method of manufacturing an optical and electrical circuit board according to claim 1,
    wherein the first photoreactive material is exposed using a mask including a plurality of lens patterns in which circular light-shielding portions having circle shape and circular light-passing portions having circle shape are arranged alternately and concentrically and a light attenuation pattern which is located around each of the lens patterns and has linear light-shielding portions having line shape and linear light-passing portions having line shape arranged alternately.

5. The method of manufacturing an optical and electrical circuit board according to claim 4,
    wherein the mask is configured such that an area ratio of an area of the linear light-passing portions to an area of the linear light-shielding portions in the light attenuation pattern is set to be less than an area ratio of an area of the circular light-passing portions to an area of the circular light-shielding portions in the lens patterns.

6. The method of manufacturing an optical and electrical circuit board according to claim 4,
    wherein the mask is configured such that, in the lens pattern, widths of the circular light-passing portions are set to be larger nearer to a center of concentric circle, and widths of the circular light-shielding portions are set to be larger nearer to an outermost periphery of the concentric circles.

7. A method of manufacturing an optical and electrical circuit board, comprising:
    providing a lens hole penetrating an object to be processed of which a first electrical wiring layer is arranged on both faces of a base layer, an insulating layer is formed on each of the first electrical wiring layers, and a second electrical wiring layer is formed on each of surfaces of the insulating layers, in a thickness direction thereof;
    providing a transparent supporting film on one face of the object to be processed so as to close one end of the lens hole;
    injecting a photoreactive material into the lens hole from an opening at the other end of the lens hole;
    exposing exposure light to the photoreactive material from the supporting film side;
    forming a cured portion and a soluble portion of the photoreactive material by partially exposing the photoreactive material to the exposure light passed through the supporting film; then
    dissolving and removing the soluble portion of the photoreactive material for development to form a filling portion having a concave part in the lens hole;
    filling a filling material having optical transparency and a refractive index higher than a refractive index of the filling portion in the concave part; and then
    curing the filling material to form a micro convex lens.

8. The method of manufacturing an optical and electrical circuit board according to claim 7, further comprising:
    exposing a portion in a region between a portion in which the micro convex lens is formed and an inner peripheral side surface of the hole in order to form a connecting portion which connects the micro convex lens to the inner peripheral side surface of the lens hole.

9. The method of manufacturing an optical and electrical circuit board according to claim 7, wherein the photoreactive material is exposed using a mask including a plurality of lens patterns being arranged in an light attenuation pattern, the plurality of lens pattern being shaped as concave lens having optical transmittance at a middle part being lower than optical transmittance of portions nearer to an outer periphery.

* * * * *